US011427755B2

(12) United States Patent
Fusco et al.

(10) Patent No.: US 11,427,755 B2
(45) Date of Patent: Aug. 30, 2022

(54) POLYMERIC COMPOSITION COMPRISING A FLUORESCENT DYE, ITS PROCESS OF PREPARATION, USE AND OBJECT COMPRISING IT

(71) Applicants: Eni S.P.A., Rome (IT); Arkema France, Colombes (FR)

(72) Inventors: Roberto Fusco, Novara (IT); Antonio Alfonso Proto, Novara (IT); Giuliana Schimperna, Novara (IT); Jean Marc Boutillier, Sauvagnon (FR); Sylvain Bourrigaud, Morlanne (FR); Sylvain Tombolato, Monein (FR); Véronique Carrere, Pau (FR)

(73) Assignees: Eni S.P.A., Rome (IT); Arkema France, Colombes (FR)

( * ) Notice: Subject to any disclaimer, the term of this patent is extended or adjusted under 35 U.S.C. 154(b) by 154 days.

(21) Appl. No.: 16/614,471

(22) PCT Filed: May 18, 2017

(86) PCT No.: PCT/IB2017/000827
§ 371 (c)(1),
(2) Date: Nov. 18, 2019

(87) PCT Pub. No.: WO2018/211304
PCT Pub. Date: Nov. 22, 2018

(65) Prior Publication Data
US 2020/0172799 A1 Jun. 4, 2020

(51) Int. Cl.
| C09K 11/02 | (2006.01) |
| C08L 33/12 | (2006.01) |
| C08L 53/00 | (2006.01) |
| C09K 11/06 | (2006.01) |
| H01L 31/055 | (2014.01) |

(52) U.S. Cl.
CPC .............. C09K 11/02 (2013.01); C08L 33/12 (2013.01); C08L 53/00 (2013.01); C09K 11/06 (2013.01); H01L 31/055 (2013.01); C09K 2211/1007 (2013.01); C09K 2211/1014 (2013.01); C09K 2211/1018 (2013.01)

(58) Field of Classification Search
CPC . C09K 11/02; C09K 11/06; C09K 2211/1007; C09K 2211/1014; C09K 2211/1016; H01L 33/051; C08L 33/12; C08L 53/00
See application file for complete search history.

(56) References Cited

U.S. PATENT DOCUMENTS

| 8,841,542 | B2* | 9/2014 | Gerard | C08F 293/005 |
| | | | | 525/299 |
| 9,176,405 | B2* | 11/2015 | Nair | G03G 9/08 |
| 9,296,854 | B2* | 3/2016 | Bourrigaud | C08F 299/04 |
| 10,105,927 | B1* | 10/2018 | Varma | B32B 27/302 |
| 10,196,510 | B2* | 2/2019 | Takahashi | G02B 5/3083 |
| 2004/0022165 | A1 | 2/2004 | Alpert | |
| 2005/0254319 | A1 | 11/2005 | Alpert et al. | |
| 2008/0149164 | A1 | 6/2008 | Goedmakers et al. | |
| 2008/0245411 | A1 | 10/2008 | Hammermann et al. | |
| 2010/0119761 | A1 | 5/2010 | Le Crum et al. | |
| 2010/0164218 | A1* | 7/2010 | Schulze-Hagenest | |
| | | | | G03G 15/6585 |
| | | | | 283/85 |
| 2012/0260975 | A1 | 10/2012 | Gerard et al. | |
| 2013/0074930 | A1 | 3/2013 | Lichtenstein et al. | |

FOREIGN PATENT DOCUMENTS

| CN | 101473246 A | | 7/2009 |
| CN | 102958988 A | | 3/2013 |
| CN | 105873963 A | | 8/2016 |
| CN | 106133038 A | | 11/2016 |
| EP | 2789620 A1 | | 10/2014 |
| JP | 2006-297614 | * | 11/2006 |
| WO | WO2011048458 A1 | | 4/2011 |
| WO | WO2011138630 A1 | | 11/2011 |
| WO | WO2012085487 A1 | | 6/2012 |
| WO | WO2014006597 A1 | | 1/2014 |
| WO | WO 2014/185509 | * | 11/2014 |
| WO | WO2015159221 A1 | | 10/2015 |
| WO | WO2016046310 A1 | | 3/2016 |
| WO | WO2016046319 A1 | | 3/2016 |

OTHER PUBLICATIONS

Translation for JP2006-297614-11/06.*
International Search Report and Written Opinion for PCT/IB2017/000827 dated Jan. 24, 2018, 10 pages.
Office Action issued by the Chinese Intellectual Property Administration in application 201780090952.9, dated Jan. 4, 2022, 9 pages. English translation of OA is provided.

* cited by examiner

*Primary Examiner* — C Melissa Koslow
(74) *Attorney, Agent, or Firm* — Praedcere Law

(57) ABSTRACT

The present invention relates to a polymeric composition comprising a polymeric elastomeric phase and a fluorescent dye. In particular the present invention relates to a polymeric composition comprising a polymeric elastomeric phase and a fluorescent dye, its process of preparation and use. The present invention concerns also objects or articles comprising a polymeric composition comprising a polymeric elastomeric phase and a fluorescent dye. The present invention concerns as well a photovoltaic module comprising a polymeric composition comprising a polymeric elastomeric phase and a fluorescent dye.

14 Claims, No Drawings

POLYMERIC COMPOSITION COMPRISING A FLUORESCENT DYE, ITS PROCESS OF PREPARATION, USE AND OBJECT COMPRISING IT

FIELD OF THE INVENTION

The present invention relates to a polymeric composition comprising a polymeric elastomeric phase and a fluorescent dye.

In particular the present invention relates to a polymeric composition comprising a polymeric elastomeric phase and a fluorescent dye, its process of preparation and use.

The present invention concerns also objects or articles comprising a polymeric composition comprising a polymeric elastomeric phase and a fluorescent dye.

The present invention concerns as well a photovoltaic module comprising a polymeric composition comprising a polymeric elastomeric phase and a fluorescent dye.

Technical Problem

It is of great interest to have polymeric compositions for photovoltaic application and photovoltaic modules and use them in photovoltaic application and photovoltaic modules, as polymers have a density that is less important than glass, for producing more light weight structures.

One type of photovoltaic module is based on luminescent solar concentrators (LSCS).

Furthermore it is of great interest to have long lasting photovoltaic modules that are efficient, resist highly to impacts, stay transparent independently of the temperature and possess an increased flexibility.

Another important point is that the photovoltaic modules should work for several years and not lose their performance.

The objective of the present invention is to provide a polymeric composition that resist highly to impacts, stay transparent independently of the temperature and possess an increased flexibility and that can absorb light and reemit it.

A further objective of the present invention is to provide a polymeric composition with that can absorb light and reemit it and does not lose this property with aging.

Still a further object of the present invention is to provide a process for the preparation of a polymeric composition that resist highly to impacts, stay transparent independently of the temperature and possess an increased flexibility and that can absorb light and reemit it and does not lose this last property with aging.

Still another object of the present invention is to use a polymeric composition that resist highly to impacts, stay transparent independently of the temperature and possess an increased flexibility and that can absorb light and reemit it and does not lose this last property with aging, in a photovoltaic application.

Another objective of the present invention is to provide an object that comprises a polymeric composition that resist highly to impacts, stay transparent independently of the temperature and possess an increased flexibility and that can absorb light and reemit it and does not lose this last property with aging.

Again still another objective of the present invention is a photovoltaic module that resist highly to impacts, stay transparent independently of the temperature and possess an increased flexibility and that can absorb light and reemit it and does not lose this last property with aging.

BACKGROUND OF THE INVENTION

Prior Art

The american patent application US 2008/0245411 discloses fluorescent solar conversion cells based on fluorescent terylene dyes. The dyes are used to dope polymer panels or are comprised in polymer coatings for glass panels, said polymers are transparent colourless thermoplastic polymers. Suitable polymers include acrylic resins, styrene polymers, polycarbonates, polyamides, polyesters, thermoplastic polyurethanes, polyethersulfones, polysulfones, vinyl polymers, or mixtures thereof. Impact modification is mentioned as well.

The american patent application US 2013/0074930 describes polymethyl (meth)-acrylate mouldings for fluorescence conversion, production of these and sheets by casting process and use in solar collectors. The castings can also be preferred impact modified castings, containing between 1 wt % and 30 wt % of an impact modifier. The impact modifiers used, are crosslinked polymer particles.

The international patent application WO 2014/006597 discloses a stack of layers comprising luminescent material, a lamp, a luminaire and a method of manufacturing the stack of layers. The luminescent layer is sandwiched between the first outer layer and the second outer layer and comprises a light transmitting matrix polymer and a luminescent material. The light transmitting polymeric material comprises at least one of: poly ethylene terephthalate (PET), poly ethylene naphtalate (PEN), poly vinylidene chloride (PVDC), poly vinylidene fluoride (PVDF), ethylene vinyl alcohol (EVOH), polybutylene terephthalate (PBT), poly acrylo nitrile (PAN) and nylon6 (PA6) and optionally, the polymeric material comprises at least one of: poly ethylene terephthalate (PET), polymethyl methacrylate (PMMA), poly carbonate (PC).

The international patent application WO 2015/159221 describes a process for the impregnation of polymer substrates. The impregnation process includes at least one organic compound. The impregnated polymer obtained from such a process can be used in luminescent solar concentrators. Preferred polymers are selected from polyacrylates, polycarbonates, polystyrenes, styrene-acrylonitrile copolymers, or mixtures thereof. An elastomeric phase of macromolecular sequences having a flexible nature with a glass transition temperature of less than 20° C. is not mentioned.

In the prior art no compositions are described having a combination of a polymeric phase, an elastomeric phase and a fluorescent dye according to the present invention.

Furthermore no loss of power during aging is mentioned in any of the cited prior art documents.

BRIEF DESCRIPTION OF THE INVENTION

Surprisingly, it has been discovered that a composition comprising a polymeric phase having a glass transition temperature of at least 50° C., an elastomeric phase of macromolecular sequences having a flexible nature with a glass transition temperature of less than 20° C., and a fluorescent dye, is performing efficient in a luminescent solar concentrators while having good mechanical properties aging performance.

It has also been found that a composition comprising a polymeric phase having a glass transition temperature of at least 50° C., an elastomeric phase of macromolecular sequences having a flexible nature with a glass transition temperature of less than 20° C., and a fluorescent dye, can be used in a photovoltaic module.

DETAILED DESCRIPTION OF THE INVENTION

According to a first aspect, the present invention relates to a composition comprising:
- a) a polymeric phase having a glass transition temperature of at least 50° C.,
- b) an elastomeric phase of macromolecular sequences having a flexible nature with a glass transition temperature of less than 20° C., and
- c) a fluorescent dye.

According to a second aspect, the present invention relates to a process for preparing a composition comprising:
- a) a polymeric phase having a glass transition temperature of at least 50° C.,
- b) an elastomeric phase of macromolecular sequences having a flexible nature with a glass transition temperature of less than 20° C., and
- c) a fluorescent dye.

According to a third aspect, the present invention relates to an article comprising a composition comprising:
- a) a polymeric phase having a glass transition temperature of at least 50° C.,
- b) an elastomeric phase of macromolecular sequences having a flexible nature with a glass transition temperature of less than 20° C., and
- c) a fluorescent dye.

According to another aspect, the present invention relates to the use of a composition comprising:
- a) a polymeric phase having a glass transition temperature of at least 50° C.,
- b) an elastomeric phase of macromolecular sequences having a flexible nature with a glass transition temperature of less than 20° C., and
- c) a fluorescent dye.

for preparation of articles.

An additional aspect of the present invention is a photovoltaic module comprising a composition comprising:
- a) a polymeric phase having a glass transition temperature of at least 50° C.,
- b) an elastomeric phase of macromolecular sequences having a flexible nature with a glass transition temperature of less than 20° C., and
- c) a fluorescent dye.

By the term "polymeric elastomeric phase" as used herein, is denoted the thermodynamic state of the polymer above its glass transition temperature.

By the term "alkyl(meth)acrylate" as used herein, is denoted the to both alkyl acrylate and alkyl methacrylate.

By the term "copolymer" as used herein, is denoted that the polymers consists of at least two different monomers.

By the term "parts" as used herein, is denoted "parts by weight".

By the term "thermoplastic polymer" as used herein, is denoted a polymer that turns to a liquid or becomes more liquid or less viscous when heated and that can take on new shapes by the application of heat and pressure.

By the term "PMMA" as used herein, are denoted homo- and copolymers of methyl methacrylate (MMA), for the copolymer of MMA the weight ratio of MMA inside the PMMA is at least 50 wt %.

By the term "fluorescent dye" as used herein, is denoted an organic molecule which has the characteristic of absorbing light and of reemitting it.

By the term "transparent or light transmitting" as used herein, is denoted a material that has a total light transmittance of at least 80% according to ASTM D1003-13 for a sheet made out of this material having a thickness of 3 mm.

The composition according to the present invention comprises a) a polymeric phase having a glass transition temperature of at least 50° C., b) an elastomeric phase of macromolecular sequences having a flexible nature with a glass transition temperature of less than 20° C., and c) a fluorescent dye.

With regard to elastomeric phase of macromolecular sequences having a flexible nature, said macromolecular sequences have a glass transition temperature of less than 20° C., preferably of less than 10° C., more preferably of less than 0° C., advantageously of less than −5° C., and more advantageously of less than −10° C.

The elastomeric phase in the composition according to the present invention can be a continuous phase, a semi-continuous phase, or a discontinuous phase.

In a first preferred embodiment, the macromolecular sequence with the flexible nature forming the elastomeric phase is part of a block copolymer with at least one block having a glass transition temperature of less than 20° C., preferably of less than 10° C., more preferably of less than 0° C., advantageously of less than −5° C., and more advantageously of less than −10° C.

The block copolymer can be selected from a thermoplastic block copolymer. Preferably, the thermoplastic block copolymer comprises at least one block which is an acrylic block. By this, is meant that at least 50 wt % of the monomers inside this block are alkyl(meth)acrylate monomers, that have been polymerized.

Advantageously, the block copolymer is amorphous. More advantageously, the block copolymer does not comprise any semicrystalline or crystalline blocks.

Most preferably, the thermoplastic block copolymer is a thermoplastic acrylic block copolymer. By this, is meant that at least 50 wt % of the monomers inside thermoplastic acrylic block copolymer are alkyl(meth)acrylate monomers, that have been polymerized.

The thermoplastic acrylic block copolymer can have a general formula (A)$_n$B in which:
- n is an integer of greater than or equal to 1,
- A is: an acrylic or methacrylic homo- or copolymer having a Tg of greater than 50° C., preferably of greater than 80° C., or polystyrene, or an acrylic/styrene or methacrylic/styrene copolymer; preferably, A is selected from methyl methacrylate (MMA), phenyl methacrylate, benzyl methacrylate, or isobornyl methacrylate; more preferably, the block A is PMMA or PMMA modified with acrylic or methacrylic comonomers;
- B is an acrylic or methacrylic homo- or copolymer having a Tg of less than 20° C., preferably comprising monomers selected from methyl acrylate, ethyl acrylate, butyl acrylate (BuA), ethylhexyl acrylate, styrene (Sty), or butyl methacrylate, more preferably butyl acrylate (BuA), said monomers make up at least 50 wt %, preferably 70 wt % of B.

Advantageously, the block copolymer is amorphous.

Preferably, in the block A the monomer is selected from methyl methacrylate (MMA), phenyl methacrylate, benzyl methacrylate, isobornyl methacrylate, styrene (Sty), or alpha-methylstyrene, or mixtures thereof. More preferably, the block A is PMMA, or PMMA copolymerized with acrylic or methacrylic comonomers, or polystyrene (PS), or polystyrene (PS) modified with styrenic comonomers.

Preferably the block B comprises monomers selected from methyl acrylate, ethyl acrylate, butyl acrylate (BuA), ethylhexyl acrylate, or butyl methacrylate, or mixtures thereof, more preferably butyl acrylate said monomers make up at least 50 wt %, preferably 70 wt % of block B.

Furthermore, the blocks A and/or B, can comprise other acrylic or methacrylic comonomers carrying various chemical function groups known to a person skilled in the art, for example acid, amide, amine, hydroxyl, epoxy, or alkoxy, functional groups. The block A can incorporate groups, such as acrylic acid, or methacrylic acid, in order to increase the temperature stability of thereof.

Comonomers like styrene can also be incorporated in the block B in order to mismatch the refractive index of the block A.

Preferably, said thermoplastic acrylic block copolymer has a structure selected from: ABA, AB, $A_3B$ and $A_4B$.

The thermoplastic acrylic block copolymer for example can be one of the following triblock copolymers: pMMA-pBuA-pMMA, p(MMAcoMAA)-pBuA-p(MMAcoMAA), p(MMAcoMAA)-p(BuAcoSty)-p(MMAcoMAA) and p(MMAcoAA)-pBuA-p(MMAcoAA). In a preferred embodiment, the block copolymer is of MAM type (PMMA-pBuA-PMMA).

It is known to a person skilled in the art that the polymers of PMMA type can comprise small amounts of acrylate comonomer in order to improve the temperature stability thereof. By small is meant less than 9 wt %, preferably less than 7 wt %, and more preferably less than 6 wt %, of the polymer.

The block B represents from 10% to 85%, preferably from 15% to 80%, of the total weight of the block copolymer.

The block B has a weight-average molar mass of between 10 000 g/mol and 500 000 g/mol, preferably of between 20 000 g/mol and 300 000 g/mol. The weight average molar mass can be measured by size exclusion chromatography (SEC).

The block copolymers participating in the composition of the matrix can be obtained by controlled radical polymerization (CRP) or by anionic polymerization; the most suitable process according to the type of copolymer to be manufactured will be selected.

Preferably, this will be CRP, in particular in the presence of nitroxides, for the block copolymers of $(A)_nB$ type and anionic or nitroxide radical polymerization, for the structures of ABA type, such as the triblock copolymer MAM. Controlled radical polymerization is described in the document for obtaining block copolymers, i.e. international patent application WO 2003/062293.

In this first preferred embodiment, the polymeric phase having a glass transition temperature of at least 50° C. can be either the block A of the thermoplastic acrylic block copolymer as describe before or another thermoplastic polymer P1 or a mixture of both.

The thermoplastic polymer P1 is selected from polyethylene terephthalate (PET), polymethyl methacrylate (PMMA), polycarbonate (PC), polyvinylidenefluoride (PVDF), poly (ethylene-vinyl acetate) (PEVA), or polyamide-grafted polyolefin.

Preferably, thermoplastic polymer P1 is selected from a homo- or copolymer of methyl methacrylate.

The thermoplastic polymer P1 can be crosslinked or not.

In a second preferred embodiment the macromolecular sequence with the flexible nature forming the elastomeric phase is part of a polymer network. The network is crosslinked, preferably in the part of the network that is not the macromolecular sequence with the flexible nature forming the elastomeric phase.

Preferably, the macromolecular sequence with the flexible nature forming the elastomeric phase that is part of a polymer network represents between 1 wt % and 30 wt % of the polymer network comprising the macromolecular sequence with the flexible nature forming the elastomeric phase and the other polymer chains and crosslinkers making up the network.

Preferably, the macromolecular sequence with the flexible nature forming the elastomeric phase, which is part of a polymer network, is a thermoplastic acrylic sequence. By this is meant that at least 50 wt % of the monomers inside thermoplastic acrylic sequence are alkyl(meth)acrylate monomers.

The alkyl(meth)acrylate monomers of the macromolecular sequence with the flexible nature forming the elastomeric phase having a Tg of less than 20° C., which is part of a polymer network, comprise monomers selected from methyl acrylate, ethyl acrylate, butyl acrylate (BuA), 2-ethylhexyl acrylate, styrene or butyl methacrylate, or mixtures thereof. More preferably butyl acrylate make up at least 50 wt %, preferably 70 wt % of said monomers of the macromolecular sequence with the flexible nature forming the elastomeric phase having a Tg of less than 20° C., which is part of a polymer network.

In this second preferred embodiment, the polymeric phase having a glass transition temperature of at least 50° C. is also part of the network.

If crosslinked, the ratio of the crosslinking is sufficient low, so that the composition according to the present invention can be still thermoformed.

With regard to the fluorescent dye or optical active compound of the composition according to the present invention is an organic molecule.

Preferably, the fluorescent dye of the composition according to the present invention comprises at least one heterocyclic cycle. More preferably the hetero atom of the heterocyclic cycle is selected from N and/or S. The heterocyclic cycle can be aromatic or not.

According to a preferred embodiment of the present invention, the fluorescent dye or optical active compound is selected from photo luminescent dyes.

The photo luminescent dyes that can be used for the purpose of the present invention can be selected from photo luminescent dyes that absorb within the UV-visible range and emit within both the UV-visible and infrared range, and which are soluble and stable in the organic solvents immiscible with water indicated hereunder.

Advantageously, the photo luminescent dyes have a maximum of the absorption at a wavelength $\lambda_{abs}$ between 300 nm and 700 nm, more advantageously between 350 nm and 600 nm.

Advantageously, the photo luminescent dyes have a maximum of the emitting at a wavelength $\lambda_{em}$ between 400 nm and 1000 nm, more advantageously between 420 nm and 900 nm.

Advantageously, the emitting wavelength $\lambda_{em}$ of the photo luminescent dye is more important than its absorption wavelength $\lambda_{abs}$. More advantageously, the difference between the maximum of emitting wavelength $\lambda_{em}$ and the maximum of absorption wavelength $\lambda_{abs}$ of one photo luminescent dye is between 5 nm and 250 nm, more advantageously between 10 nm and 200 nm.

According to a more preferred embodiment of the present invention, said photo luminescent dyes can be selected, for example, from: perylene compounds known with the tradename Lumogen® from BASF; acene compounds described, for example, in international patent application WO 2011/048458; benzothiadiazole compounds, in particular 4,7-di-(thien-2'-yl)-2,1,3-benzothiadiazole (DTB), described, for example, in international patent application WO 2011/048458; compounds comprising a benzoetherodiazole group and at least one benzodithiophene group described, for example, in international patent application WO 2013/098726; disubstituted naphthothiadiazole compounds described, for example, in european patent application EP 2 789 620; benzoheterodiazole compounds disubstituted with benzodithiophene groups described, for example, in european patent application EP 2 789 620; disubstituted benzoheterodiazole compounds described, for example, in international patent application WO 2016/0046310; disubstituted diaryloxybenzoheterodiazole compounds described, for example, in international patent application WO 2016/0046319.

Preferably, said photoluminescent dyes can be selected, for example, from: N,N'-bis(2',6'-di-iso-propylphenyl) (1,6,7,12-tetraphenoxy) (3,4,9,10-perylene-diimide (Lumogen® F Red 305-Basf), 4,7-di(thien-2'yl)-2,1,3-benzothiadiazole (DTB), 5,6-diphenoxy-4,7-bis(2-thienyl)-2,1,3-benzothiadiazole (DTBOP), 5,6-diphenoxy-4,7-bis[5-(2,6-dimethylphenyl)-2-thienyl]benzo[c]1,2,5-thiadiazole (MPDTBOP), 5,6-diphenoxy-4,7-bis[5-(2,5-dimethylphenyl)-2-thienyl]benzo[c]1,2,5-thiadiazole (PPDTBOP), 4,7-bis[5-(2,6-dimethylphenyl)-2-thienyl]benzo[c]1,2,5-thiadiazole (MPDTB), 4,7-bis[5-(2,6-di-iso-propylphenyl)-2-thienyl]benzo[c]1,2,5-thiadiazole (IPPDTB), 4,7-bis[4,5-(2,6-dimethylphenyl)-2-thienyl]benzo[c]1,2,5-thiadiazole (2MPDTB) 4,7-bis(7',8'-dibutylbenzo[1',2'-b':4',3'-b"]dithien-5'-yl)-benzo[c][1,2,5]thiadiazole (F500), 4,9-bis(7',8'-dibutylbenzo[1',2'-b':4',3'-b"]dith-ien-5'-yl)-naphto[2,3-c][1,2,5]thiadiazole (F521), 4,7-bis(5-(thiophen-2-yl)thiophen-2-yl)benzo[c][1,2,5]thiadiazole (QTB), 4,9-bis(thien-2'-yl)-naphto[2,3-c][1,2,5]thiadiazole (DTN), 9,10-diphenylanthracene (DPA), or mixtures thereof. N,N'-bis(2',6'-di-iso-propylphenyl) (1,6,7,12-tetraphenoxy) (3,4,9,10-perylene-diimide (Lumogen® F Red 305-Basf) is particularly preferred. The composition according to the present invention comprises from 1 ppm to 10 000 ppm of the fluorescent dye, preferably from 5 ppm to 5 000 ppm, more preferably from 10 ppm to 1 000 ppm, still more preferably from 10 ppm to 1 000 ppm, based on the three compounds a), b) and c).

The elastomeric phase of macromolecular sequences having a flexible nature with a glass transition temperature of less than 20° C., makes up at least 1 wt % of the composition, preferably at least 2 wt %, and more preferably at least 5 wt %, based on the three compounds a), b) and c).

The composition according to the present invention can optionally also comprise UV absorbers, UV stabilizers, radical inhibitors.

In a first preferred embodiment, the composition according to the present invention comprising the polymeric phase having a glass transition temperature of at least 50° C., the elastomeric phase of macromolecular sequences having a flexible nature with a glass transition temperature of less than 20° C., and the fluorescent dye as detailed before, is in form of as sheet.

The sheet comprising the composition of the present invention has a thickness of between 0.5 mm and 500 mm.

The concentration of the fluorescent dye in the composition is at least $7.4*10^{-6}$ ppm/mm$^3$ of the composition comprising the three components a), b) and c); preferably is at least $7.4*10^{-5}$ ppm/mm$^3$.

The sheet can be flat, slightly bent or curved.

A first method of preparation of a composition according to the first preferred embodiment of the present invention where the macromolecular sequence with the flexible nature forming the elastomeric phase is part of a block copolymer, comprises a blending step of the respective compounds.

This first method of preparation of the composition according to the present invention is blending the component comprising the elastomeric phase of macromolecular sequences having a flexible nature with the fluorescent dye, the polymeric phase having a glass transition temperature of at least 50° C. is already part of the blockcopolymer.

Optionally another thermoplastic polymer P1, selected from those reported above, could also be blended with.

The two or three components could be heated if necessary during blending.

Mixing could also be obtained by dry blending a solid resin comprising the elastomeric phase of macromolecular sequences having a flexible nature and composition comprising fluorescent dye.

The composition according to the first preferred embodiment of the present invention can be transformed by injection molding, extrusion or coextrusion for the preparation of sheets or films.

A second method of preparation of a composition according to the second preferred embodiment of the present invention, where the macromolecular sequence with the flexible nature forming the elastomeric phase is part of a polymer network, comprises the steps of mixing the fluorescent dye with at least one monomer and macromolecular sequences having a flexible nature followed by a polymerisation step.

An example for this method for preparation of a composition according to the present invention would be a cast sheet polymerization wherein the fluorescent dye is mixed with the monomer or monomers and the other ingredients before the polymerization. Such a method, excluding the fluorescent dye, is describe in international patent application WO 2012/085487.

As reported above, said polymeric composition can be advantageously used in photovoltaic module. Said photovoltaic module can be advantageously integrated in buildings and houses (for example, in photovoltaic windows, in photovoltaic skylights, in greenhouses, for both indoor and outdoor). Furthermore, said photovoltaic module can also be advantageously used as a functional element in urban and transport contexts (for example, in photovoltaic noise barriers, in photovoltaic windbreak, in photovoltaic cantilever roof).

Preferably, the composition according to the present invention is transparent. More preferably, the composition according to the present invention is transparent with a total light transmittance of 80% or more, preferably 85% or more, the total light transmittance being measured in accordance with ASTM D1003-13 for a sample with 3 mm thickness.

The composition of the present invention can be used in articles.

The articles of the present invention can for example be in form of a sheet, block, film, tube, or profiled element.

The present invention concerns as well a photovoltaic module or device comprising the composition according to the present invention.

The present invention concerns as well a photovoltaic module comprising a layer comprising the composition according to the present invention.

The present invention concerns as well a photovoltaic module comprising a layer made of the composition according to the present invention.

The present invention concerns as well a photovoltaic module comprising a sheet comprising the composition according to the present invention.

The present invention concerns as well a photovoltaic module comprising at least one sheet made of the composition according to the present invention.

The photovoltaic module or device comprises also at least one photovoltaic cell, and at least one luminescent solar concentrator (LSC).

Methods of Evaluation

The weight average molecular weight of polymeric compound can be measure by size exclusion chromatography (SEC).

The glass transition temperature (Tg) of the polymers is measured with differential scanning calorimetry (DSC) according standard ISO 11357-2/2013.

The thermomechanical analysis are carried out by means of RDAII "RHEOMETRICS DYNAMIC ANALYSER" proposed by the Rheometrics Company. The thermo mechanical analysis measures precisely the visco-elastics changes of a sample in function of the temperature, the strain or the deformation applied. The apparatus records continuously, the sample deformation, keeping the stain fixed, during a controlled program of temperature variation.

The results are obtained by drawing, in function of the temperature, the elastic modulus (G'), the loss modulus and the tan delta. The Tg is higher temperature value read in the tan delta curve, when the derived of tan delta is equal to zero.

The ageing test is made according the standard procedure DIN EN ISO 4892-2-A1 2003-11 using an ATLAS XenoTest Beta+, equipped with a Xenon lamp air cooled and filtered by a Xenochrome 300 filter.

The maximum of the absorption at a wavelength $\lambda_{abs}$ and the maximum of the emitting at a wavelength $\lambda_{em}$ of photo luminescent dyes can obtained from a spectrum measured with a spectrofluorimeter.

The optical properties of the polymers are measured according to following method: light transmittance and haze are measured according to the standard ASTM D1003-13, sheets of 3 mm thickness.

EXAMPLES

The series of examples concern the preparation of PMMA sheets comprising and a fluorescent dye.

One sheet according to the invention comprises an elastomeric phase of macromolecular sequences having a flexible nature with a glass transition temperature of less than 20° C., the comparative sheet does not comprise this elastomeric phase.

The PMMA sheets are prepared by cast polymerization of methyl methacrylate (MMA).

As fluorescent dye Lumogen® F Red 305 from BASF was used at 160 ppm in Example 1 and in Comparative Example 1.

The sheet according to the present invention was prepared according to example test 2 of international patent application WO 2012/085487.

The dimension of the sheets is 300×75×6 mm.

Two sheet samples of 300×75×6 mm were tested by measuring the average power generated by a photovoltaic cell, i.e. an IXYS-KXOB22-12 photovoltaic cell having a surface area of 1.2 cm$^2$ which was optically coupled at the center of the 75 mm edge. The samples were irradiated with the light generated by a Solar Simulator (1000 W/m$^2$ AM 1.5). The light spot is 100×100 mm large and the sheet was irradiated perpendicularly to the 30×75 mm face. Several measurements were done moving the sheet in different position. The maximum power determined by a multimeter from J-V plots by plotting the power as a function of the distance d from the cell of the spot edge near the cell. An average power value <P> is calculated from the power values measured at different d values.

Then both samples are aged. The average power values <P> were evaluated for different ageing times of both samples.

Example 1

The sample has an initial average power value <P> of 5.8 mW.

After 1000 hours of ageing the sample has an average power value <P> of 8.8 mW.

After 3000 hours of ageing the sample has an average power value <P> of 8.8 mW

Comparative Example 1

The sample has an initial average power value <P>x of 8.2 mW.

After 1000 hours of ageing the sample has an average power value <P> of 7.2 mW.

After 3000 hours of ageing the sample has an average power value <P> of 8.4 mW

The tests shows that the composition according to the invention performs good in such an application, and even better after ageing.

In the following examples, a sheet according to the present invention is prepared as in Example 1, while using other dyes and other quantities of such dyes in the composition.

Example 2

The average power value <P> was measured as above reported. As fluorescent dye the 4,7-di-(thien-2'-yl)-2,1,3-benzothiadiazole (DTB)] was used at 100 ppm.

The average power value <P> was 6.09 mW.

Example 3

The average power value <P> was measured as above reported. As fluorescent dye the 5,6-diphenoxy-4,7-bis(2-thienyl)-2,1,3-benzothiadiazole (DTBOP) was used at 160 ppm.

The average power value <P> was 6.24 mW.

Example 4

The average power value <P> was measured as above reported.

As fluorescent dye the 5,6-diphenoxy-4,7-bis[5-(2,6-dimethylphenyl)-2-thienyl]benzo[c]1,2,5-thiadiazole (MPDT-BOP) was used at 200 ppm.

The average power value <P> was 7.28 mW.

Example 5

The average power value <P> was measured as above reported.

As fluorescent dye the 5,6-diphenoxy-4,7-bis[5-(2,5-dimethylphenyl)-2-thienyl]benzo[c]1,2,5-thiadiazole (PPDT-BOP) was used at 200 ppm.

The average power value <P> was 9.68 mW.

Example 6

The average power value <P> was measured as above reported.

As fluorescent dye the 4,7-bis[5-(2,6-dimethylphenyl)-2-thienyl]benzo[c]1,2,5-thiadiazole (MPDTB) was used at 170 ppm.

The average power value <P> was 9.02 mW.

Example 7

The average power value <P> was measured as above reported. As fluorescent dye the 4,7-bis[5-(2,6-di-iso-propylphenyl)-2-thienyl]benzo[c]1,2,5-thiadiazole (IPPDTB) was used at 200 ppm.

The average power value <P> was 9.17 mW.*

Example 8

The average power value <P> was measured as above reported. As fluorescent dye the 4,7-bis[4,5-(2,6-dimrthylphenyl)-2-thienyl]benzo[c]1,2,5-thiadiazole (2MPDTB) was used at 200 ppm.

The average power value <P> was 10.04 mW.

Example 9

The average power value <P> was measured as above reported.

As fluorescent dye the 4,7-bis(7',8'-dibutylbenzo[1',2'-b': 4',3'-b"]dithien-5'-yl)-benzo[c][1,2,5]thiadiazole (F500) was used at 100 ppm.

The average power value <P> was 9.92 mW.

Example 10

The average power value <P> was measured as above reported. As fluorescent dye the 4,9-bis(7',8'-dibutylbenzo[1',2'-b':4',3'-b"]dith-ien-5'-yl)-naphto[2,3-c][1,2,5]thiadiazole (F521) was used at 250 ppm.

The average power value <P> was 8.64 mW.

Example 11

The average power value <P> was measured as above reported. As fluorescent dye the 4,7-bis(5-(thiophen-2-yl)thiophen-2-yl)benzo[c][1,2,5]thiadiazole (QTB) was used at 100 ppm.

The average power value <P> was 8.19 mW.

Example 12

The average power value <P> was measured as above reported. As fluorescent dye the 4,9-bis(thien-2'-yl)-naphto[2,3-c][1,2,5]thiadiazole (DTN) was used at 150 ppm.

The average power value <P> was 8.19 mW.

The invention claimed is:

1. A luminescent solar concentrator including a composition comprising:
   a polymeric phase having a glass transition temperature of at least 50° C.; and
   an acrylic block copolymer having a general formula $(A)_nB$ in which:
      n is an integer of greater than or equal to 1,
      block A includes an acrylic or methacrylic homo- or copolymer having a Tg of greater than 50° C., or polystyrene, or an acrylic/styrene or methacrylic/styrene copolymer,
      wherein said block A forms a polymeric phase,
      block B includes an acrylic or methacrylic homo- or copolymer having a Tg of less than 20° C.,
      wherein said block B forms an elastomeric phase of macromolecular sequences having a flexible nature; and
   a photo luminescent dye.

2. The luminescent solar concentrator according to claim 1, wherein said polymeric phase includes a thermoplastic polymer P1 selected from polyethylene terephthalate (PT), a homo- or copolymer of methyl methacrylate, polycarbonate (PC), polyvinylidenefluoride (PVDF), poly (ethylene-vinyl acetate) (PEVA), or polyamide-grafted polyolefin.

3. The luminescent solar concentrator according to claim 1, wherein said block B has a weight average molecular weight of between 10 000 g/mol and 500 000 g/mol.

4. The luminescent solar concentrator according to claim 1, comprising from 1 ppm to 10 000 ppm of the photo luminescent dye based on the weight of the composition.

5. The luminescent solar concentrator according to claim 1, wherein said photo luminescent dye comprises at least one heterocyclic ring.

6. The luminescent solar concentrator according to claim 1, wherein said photo luminescent dye has a maximum of absorption at a wavelength $\lambda_{abs}$ between 300 nm and 700 nm.

7. The luminescent solar concentrator according to claim 1, wherein said photo luminescent dye has a maximum of the emission at a wavelength $\lambda_{em}$ between 400 nm and 1000 nm.

8. The luminescent solar concentrator according to claim 1, wherein the difference between the maximum of an emission wavelength $\lambda_{em}$ and the maximum of an absorption wavelength $\lambda_{abs}$ of said photo luminescent dye is between 5 nm and 250 nm.

9. The luminescent solar concentrator according to claim 1, wherein said photo luminescent dye comprises at least one dye selected from: a perylene compound known by the trade-name Lumogen® from BASF; an acene compound; a benzothiadiazole compound; a compound comprising a benzoetherodiazole group and at least one benzodithiophene group; a disubstituted naphthothiadiazole compound; a benzoheterodiazole compound disubstituted with benzodithiophene groups; a disubstituted benzoheterodiazole compound; or a disubstituted diaryloxybenzoheterodiazole compound.

10. A luminescent solar concentrator including a composition comprising:
   a) a polymeric phase having a glass transition temperature of at least 50° C.,
   b) an elastomeric phase of macromolecular sequences having a flexible nature with a glass transition temperature of less than 20° C.,
      wherein said elastomeric phase and said polymeric phase are part of a polymer network, and
   c) a photo luminescent dye.

11. The luminescent solar concentrator according to claim 10, wherein said elastomeric phase represents between 1 wt % and 30 wt % of the polymer network.

12. The luminescent solar concentrator according to claim 10 wherein said elastomeric phase is a thermoplastic acrylic sequence containing at least 50% of alkyl(meth)acrylate monomers.

13. The luminescent solar concentrator according to claim 12 wherein said alkyl(meth)acrylate monomers are selected from methyl acrylate, ethyl acrylate, butyl acrylate, 2-ethylhexyl acrylate, styrene or butyl methacrylate, or mixtures thereof.

14. A photovoltaic module including a composition comprising:
 a) a polymeric phase having a glass transition temperature of at least 50° C.,
 b) an elastomeric phase of macromolecular sequences having a flexible nature with a glass transition temperature of less than 20° C.,
 wherein said elastomeric phase and said polymeric phase are part of a polymer network, and
 c) a photo luminescent dye.

\* \* \* \* \*